United States Patent
McCutcheon et al.

(10) Patent No.: US 7,790,231 B2
(45) Date of Patent: Sep. 7, 2010

(54) AUTOMATED PROCESS AND APPARATUS FOR PLANARIZATION OF TOPOGRAPHICAL SURFACES

(75) Inventors: Jeremy McCutcheon, Rolla, MO (US); James E. Lamb, III, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 1189 days.

(21) Appl. No.: 10/887,530

(22) Filed: Jul. 8, 2004

(65) Prior Publication Data

US 2005/0056963 A1  Mar. 17, 2005

Related U.S. Application Data

(60) Provisional application No. 60/486,021, filed on Jul. 10, 2003.

(51) Int. Cl.
*B05D 3/12* (2006.01)
*B05D 3/06* (2006.01)
(52) U.S. Cl. .................. 427/355; 427/508; 427/294
(58) Field of Classification Search .......... 427/508, 427/294, 355, 358
See application file for complete search history.

(56) References Cited

U.S. PATENT DOCUMENTS 4,383,020 A * 5/1983 Roberts et al. .............. 430/127
4,515,828 A    5/1985 Economy et al.
5,434,107 A    7/1995 Paranjpe
5,605,867 A    2/1997 Sato et al.
(Continued)

FOREIGN PATENT DOCUMENTS

EP    0 683 511    11/1995
(Continued)

OTHER PUBLICATIONS

"Introduction to Microlithograpy," Second edition, edited by Larry F. Thompson, C. Grant Wilson, and Murrae J. Bowden, ACS Professional Reference Book, American Chemical Society, Washington, DC, 1994, pp. 232-239, pp. 347-348, and pp. 356-361.

(Continued)

*Primary Examiner*—William Phillip Fletcher, III
(74) *Attorney, Agent, or Firm*—Hovey Williams LLP

(57) ABSTRACT

An improved apparatus (20) and method are provided for effective, high speed contact planarization of coated curable substrates such as microelectronic devices to achieve very high degrees of planarization. The apparatus (20) includes a planarizing unit (28) preferably having an optical flat flexible sheet (88) and a backup optical flat body (82), and a curing assembly (30). In operation, a substrate (78) having a planarizable coating (76) is placed within a vacuum chamber (26) beneath sheet (88) and body (82). A pressure differential is created across sheet (88) so as to deflect the sheet into contact with a central region C of the coating (76), whereupon the coating (76) is brought into full planarizing contact with sheet (88) and body (82) by means of a support (114) and vacuum chuck (120); at this point the coating (76) is cured using assembly (30). After curing, a pressure differential is established across sheet (88) for sequentially separating the sheet from the peripheral portion P of the coating, and then full separation of the sheet (88) and coating (76).

15 Claims, 12 Drawing Sheets

U.S. PATENT DOCUMENTS

| | | | |
|---|---|---|---|
| 5,650,261 A | 7/1997 | Winkle | |
| 5,679,610 A | 10/1997 | Matsuda et al. | |
| 5,736,424 A | 4/1998 | Prybyla et al. | |
| 5,756,256 A | 5/1998 | Nakato et al. | |
| 5,935,762 A | 8/1999 | Dai et al. | |
| 5,967,030 A | 10/1999 | Blalock | |
| 5,985,490 A * | 11/1999 | Suga et al. | 430/2 |
| 5,985,524 A | 11/1999 | Allen et al. | |
| 6,044,851 A | 4/2000 | Grieger et al. | |
| 6,048,799 A | 4/2000 | Prybyla | |
| 6,062,133 A | 5/2000 | Blalock | |
| 6,218,316 B1 * | 4/2001 | Marsh | 438/780 |
| 6,237,483 B1 * | 5/2001 | Blalock | 100/211 |
| 6,316,363 B1 * | 11/2001 | Blalock et al. | 438/691 |
| 6,331,488 B1 * | 12/2001 | Doan et al. | 438/698 |
| 6,391,798 B1 | 5/2002 | DeFelice et al. | |
| 6,403,499 B2 * | 6/2002 | Marsh | 438/780 |
| 6,407,006 B1 | 6/2002 | Levert et al. | |
| 6,506,679 B2 * | 1/2003 | Blalock et al. | 438/691 |
| 6,518,172 B1 * | 2/2003 | Blalock et al. | 438/626 |
| 6,544,466 B1 | 4/2003 | Westmoreland | |
| 6,580,172 B2 | 6/2003 | Mancini et al. | |
| 6,610,593 B2 | 8/2003 | Kohl et al. | |
| 6,677,252 B2 * | 1/2004 | Marsh | 438/780 |
| 6,683,003 B2 * | 1/2004 | Blalock | 438/691 |
| 6,693,034 B2 * | 2/2004 | Blalock et al. | 438/691 |
| 6,716,767 B2 | 4/2004 | Shih et al. | |
| 6,743,724 B2 * | 6/2004 | Doan et al. | 438/692 |
| 6,797,607 B2 | 9/2004 | Endisch et al. | |
| 7,082,876 B2 | 8/2006 | Olsson | |
| 2002/0093122 A1 | 7/2002 | Choi et al. | |
| 2002/0106899 A1 * | 8/2002 | Blalock et al. | 438/691 |
| 2004/0029041 A1 | 2/2004 | Shih et al. | |
| 2004/0040644 A1 | 3/2004 | Chang et al. | |
| 2005/0020046 A1 | 1/2005 | Brenner | |

FOREIGN PATENT DOCUMENTS

| | | |
|---|---|---|
| JP | 6-22199 | 3/1994 |
| JP | 7-221006 | 8/1995 |
| JP | 8-88169 | 4/1996 |

OTHER PUBLICATIONS

"Dual-Damascene Interconnects" in Silicon Processing for the VLSI Era, vol. 4: Deep Submicron Process Technology, Stanley Wolf, Lattice Press, Sunset Beach, California, 2002, Ch. 15, pp. 671-710.

Cesar M. Garza, Jeffrey D. Byers, Lewis Flanigin, and Maureen Hanratty, "Photoresist Materials and Processing" in "Handbook of Semiconductor Manufacturing Technology," edited by Yoshio Nishi and Robert Doering, Marcel Dekker, Inc., New York City, New York, 2000, pp. 528-537.

SC Solutions; Chemical Mechanical Planarization (CMP)—4 pages, Jan. 27, 2004.

Tech Brief—Chemical Mechanical Planarization (CMP); 2003; IC Knowledge—1 page.

* cited by examiner

AUTOMATED PROCESS AND APPARATUS FOR PLANARIZATION OF TOPOGRAPHICAL SURFACES

CROSS REFERENCED TO RELATED APPLICATION

This application claims the benefit of provisional application Ser. No. 60/486,021 filed Jul. 10, 2003. This provisional application is incorporated by reference herein.

This invention was made with the U.S. Government support under ATP #70NANB1H3019 awarded by the National Institute of Standards and Technology (NIST). The Government has certain rights in the invention.

BACKGROUND OF THE INVENTION

1. Field of the Invention

The present invention is broadly concerned with the improved methods and apparatus for the contact planarization of surfaces such as those developed during the manufacture of advanced integrated circuit and other devices. More particularly, the invention is concerned with such methods and apparatus wherein a coated substrate is placed adjacent an optical flat flexible sheet, and the latter is first deflected to contact a central region of the coating, followed by full, pressurized planarizing contact between the sheet and coating; during such pressurized planarizing contact, the coating is cured. Post-curing separation of the sheet and coating preferably involves generating a pressure differential between the sheet and coating which creates a smooth edge-to-center separation.

2. Description of the Prior Art

Advanced integrated circuit (IC) designs are highly dependent on increasingly complex device-layering techniques to produce semiconductor devices that are more powerful, have lower profiles, and require less energy to operate. To make these qualities possible, more circuits with much finer structures must be integrated into a microchip by constructing multiple layers of interconnects and dielectrics on a semiconductor substrate in an appropriate sequence. To construct an IC, many layers containing ultra-fine structures must be patterned onto a semiconductor surface. Currently, photolithography is the predominant technique used to pattern these ultra-fine structures. This technique requires materials to be deposited and removed from the surface to construct such ultra-fine structures.

Photolithography involves depositing a photosensitive material, known as a photoresist, onto a semiconductor substrate surface. An optical transparent object, known as the photomask or reticle, with pre-defined images of the structures to be built on the semiconductor surface is placed above the photoresist-coated substrate. An appropriate wavelength of light is illuminated through the optical object. The light either decomposes or cures the exposed area of the photoresist, depending on the nature of the photoresist and the process. The semiconductor surface is then developed to produce the patterned image on the substrate surface, and the device is ready for subsequent processing.

Materials can be applied in a uniform thickness if the surface to be coated is entirely planar. However, if the surface is not planar, that is, it has topographic features, materials may not coat with a uniform thickness, which may greatly affect the final yield or performance of the device. A coating deposited on top of a topographic surface tends to contour the topography of the underlying surface, thus producing a non-planar surface.

Fabricating one layer on top of another produces the multi-layer structure of an IC. The first layer of the structure is built on a totally planar semiconductor surface. As a result, a topographic surface is introduced onto the semiconductor substrate surface. The second layer is built on top of the topographic surface of the first structural layer. As more layers are built on the substrate, the severity of the surface topography increases. The non-planar surface is no longer suitable for constructing the next structural layer. Therefore, the topographic surface needs to be planarized, or flattened, prior to the construction of the next layer. To planarize the topographic surface, techniques such as plasma etch-back, chemical mechanical polishing (CMP), and contact planarization can be used.

The plasma etch-back technique involves the deposition of a thick film to smooth the underlying topographic surface to some extent. As the thickness of the film increases, surface planarity is improved. However, a longer plasma etch time is needed to etch the thicker films. The deposited film is required to have a matched plasma etch rate to that of the underlying topographic layer material under specific etch parameters. Subsequently, the thick film is etched in a plasma etcher to the underneath topographic layer to improve th surface planarity. This planarization technique has been used and known to those skilled in the art.

The CMP technique uses a slurry solution to mechanically polish the surface against a pad with the assistance of chemical reactions that occur between the substrate material and the slurry solution. A slurry solution containing abrasive particles and certain chemicals is dispensed on the pad surface. The topographic substrate surface is pressed against the pad. The substrate is then polished with a circular motion against the pad to remove the topography of the surface. CMP is currently used in IC fabrication. The specific requirements and processing conditions for certain materials that need to be planarized are known to those skilled in the art.

Contact planarization, in theory, provides an alternative to plasma etch-back and CMP techniques to planarize topographic surfaces the topographic surface is first deposited with a flowable planarization material. Subsequently, the surface is pressed against an optical flat surface, which allows the material to flow around the topographic structures under certain conditions. The material is then hardened by either photo-irradiation or heat to replicate the planarity of the optical flat surface onto the planarized material surface. The planarized material surface is then released from the optical flat object surface. To facilitate the separation, the optical flat object surface can be treated with a known art to lower its surface energy. This can be achieved by depositing a thin film or low surface energy material, such as a fluoropolymer or a fluorinated compound, onto the optical flat object surface. Another approach is to put a low surface energy material with comparable surface planarity, such as a disk or film, between the planarization material and optical flat object surface. Examples of low surface energy materials are Teflon® materials, fluorocarbon polymers, or the like. The planarized material surface then undergoes plasma etch to the underlying topographic layer. The planarity of the optical flat surface is transferred to the underlying topographic layer. The topographic surface is then planarized. One requirement of the planarized material is that it needs to possess a plasma etch ratio of 1 in relation to that of the underlying topographic layer material. The plasma etch parameters required to reach a 1:1 etch rate ratio are known to those skilled in the art.

U.S. Pat. No. 6,048,799 to Prybyla et al. described the use of an optical flat surface in contact with a material that can be solidified by heat or ultraviolet (UV) irradiation to planarize topographical surfaces. The Prybyla patent does not provide the details associated with reducing the technology to practice. Specifically the separation of the coated wafer from the optical flat surface and the optimal range of process parameters required to perform fully automated contact planarization are not discussed.

Blalock et al. (U.S. Pat. No. 6,062,133) describes method and apparatus for achieving a global planarization of a surface of a deformable layer of a wafer using a curable planarization material. A deformable material is deposited onto a substrate surface. This substrate is then placed in to the apparatus with the deformable material-coated surface facing toward and pressing against an optical flat object surface under certain press force and time. The deformable material is then cured while still in contact with the optical flat object surface. The planarity of the optical flat object surface is replicated to the coated substrate surface. Like the Prybyla et al. patent, this process and apparatus does not cover the separation of the coated wafer from the optical flat surface and the optimal range of process parameters required to perform fully automated contact planarization.

In U.S. Pat. No. 6,331,488 B1, Doan et al. describes a planarization process for semiconductor substrates. This process uses an optical flat surface to press against a nonplanar insulating material-coated substrate surface onto which a deformable material is coated. The deformable material is cured while still in contact with the optical flat surface. The planarity of the optical flat surface is replicated to the planarized deformable material surface. The planarized surface then undergoes the CMP process to transfer the planarity of the planarized surface to the underlying insulating layer. This patent also fails to include the process for separating the coated wafer from the optical flat surface and the optimal range of process parameters to perform contact planarization fully automated.

SUMMARY OF THE INVENTION

The present invention overcomes the problems outlined above and provides improved contact planarizing apparatus and corresponding methods, which are capable of quickly and efficiently planarizing various coated substrates, while achieving very high planarization ratios. Broadly speaking, the apparatus of the invention includes a support operable to engage and hold a thin flexible sheet of material (which is preferably an optically flat material fabricated from Teflon, other fluorocarbon polymers, or silicones) with an assembly operable to support and hold a substrate with the coating thereof proximal to the sheet. A differential pressure assembly is also provided to create a pressure differential across the sheet of sufficient magnitude to deflect the sheet so that the latter contacts the central region of the surface of the coating, but is spaced from the periphery thereof. The support assembly is also shiftable for moving the substrate into face-to-face planarizing contact with the sheet throughout substantially the entirety of the surface area of the coating. Finally, the apparatus includes a device for curing the coating during the course of such full planarizing contact.

In its method aspects, the invention includes the steps of first locating a thin, flexible sheet of material in proximal spaced relationship to the surface of a planarizable coating on a substrate, and then causing the sheet to deflect so that the sheet contacts a central region of the coating surface but is spaced from the periphery thereof. Next, relative movement is effected between the substrate and sheet until the latter is in full face-to-face planarizing contact with the entirety of the surface area of the coating. In this condition, the coating is cured, usually by using UV radiation or heat. Preferably, during separation of the cured coating and the flexible sheet, a pressure differential is created across the latter to first separate the sheet from the periphery of the cured coating, followed by full separation thereof.

In one embodiment, a solid planarizing body is provided having a planarizing surface which mates with the flexible sheet. Alternately, appropriate levels of air pressure and vacuum are used for manipulation of the flexible planarizing sheet without the need for a solid backup planarizing body.

DETAILED DESCRIPTION OF THE PREFERRED EMBODIMENT

Embodiment of FIGS. 1-14

Figure 1:
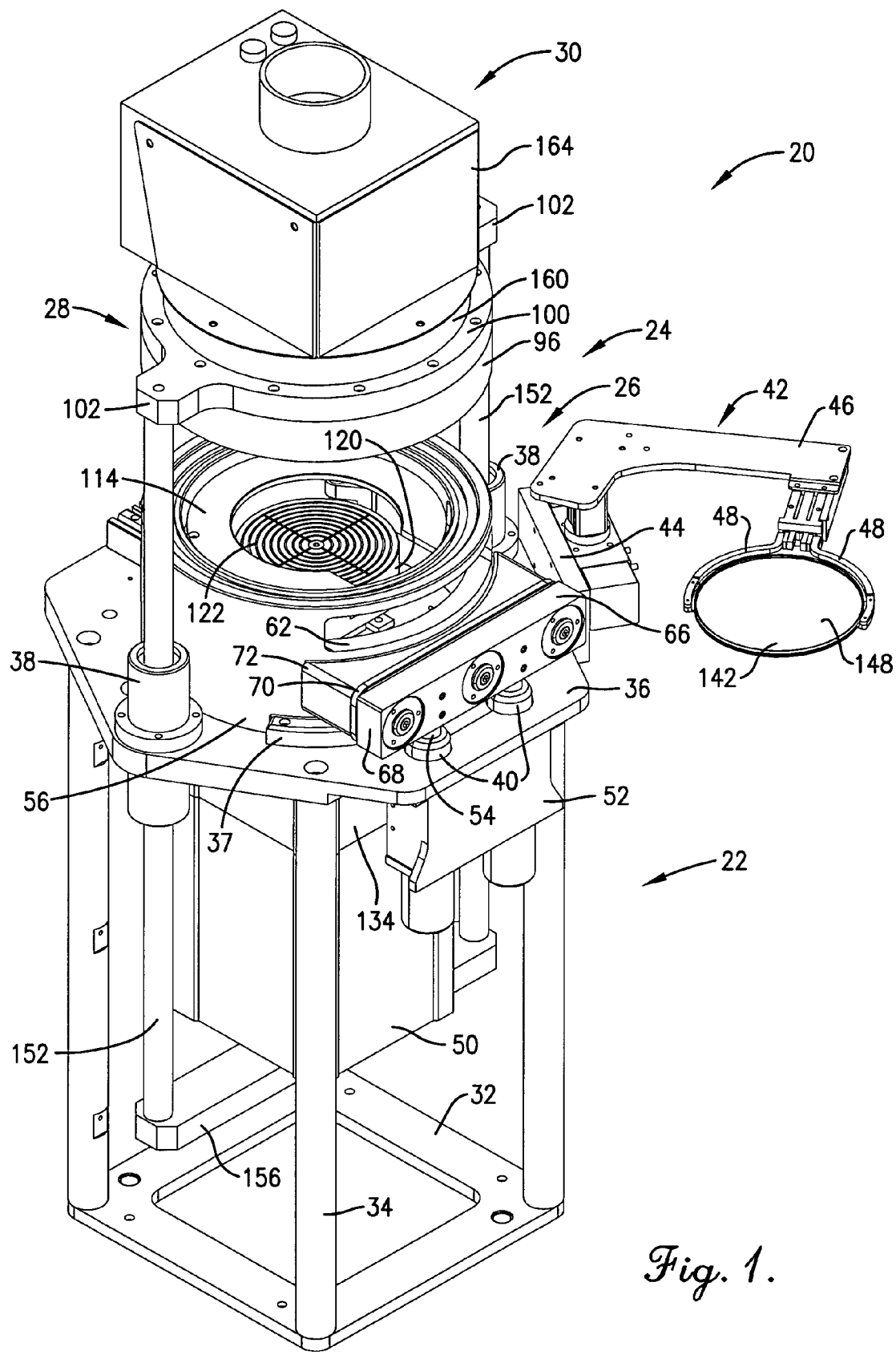
FIG. 1 is a perspective view of a preferred planarizing apparatus in accordance with the invention, illustrated with a robotic arm of the apparatus supporting a resilient platen used in the preferred planarizing method, prior to insertion of the platen into the primary vacuumization chamber of the apparatus.

Turning now to the drawings, FIG. 1 illustrates a preferred planarization apparatus 20 in accordance with the invention. The apparatus 20 broadly includes a support frame 22, and a planarizing assembly 24 atop the latter. The planarizing assembly 24 includes a lower vacuum chamber 26 together with an upper planarizing unit 28 and a UV light curing assembly 30. The overall apparatus 20 is designed to efficiently contact planarize coatings applied to individual substrates, such as microelectronic, optoelectronics, photonic, optical, flat panel display, microelectromechanical systems (MEMS), biochips and sensor devices.

In more detail, the support frame 22 includes a base 32 with four upstanding, rigid support legs 34 secured thereto. A base plate 36 is affixed to the upper ends of the legs 34, and has a pair of opposed tubular guides 38 and a further pair of laterally spaced apart, forward tubular guides 40. A conventional robotic arm assembly 42 is also secured to base plate 36 via coupler 44. The assembly 42 has a pivotally mounted arm 46 terminating in a pair of opposed, arcuate support segments 48. The base plate 36 also supports superposed piston and cylinder assemblies 50, 134. Finally, a dual piston and cylinder assembly 52 is secured to the underside of base plate 36 with the piston rods 54 thereof extending upwardly through the forward guides 40 for purposes which will be explained.

Figure 2:
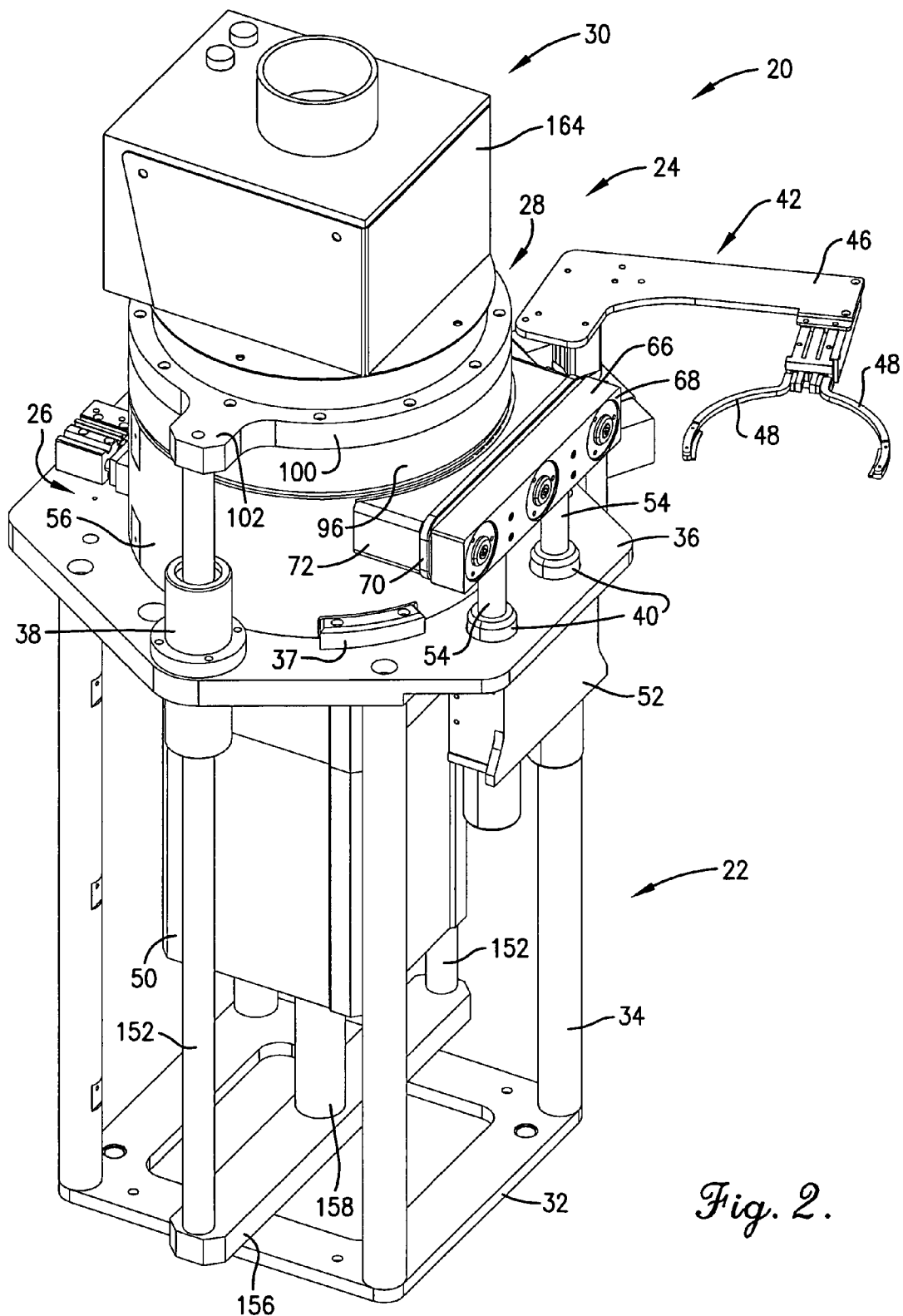
FIG. 2 is a view similar to that of FIG. 1, but illustrating the apparatus during use thereof with the resilient platen inserted into the primary vacuumization chamber, the latter being closed.
Figure 3:
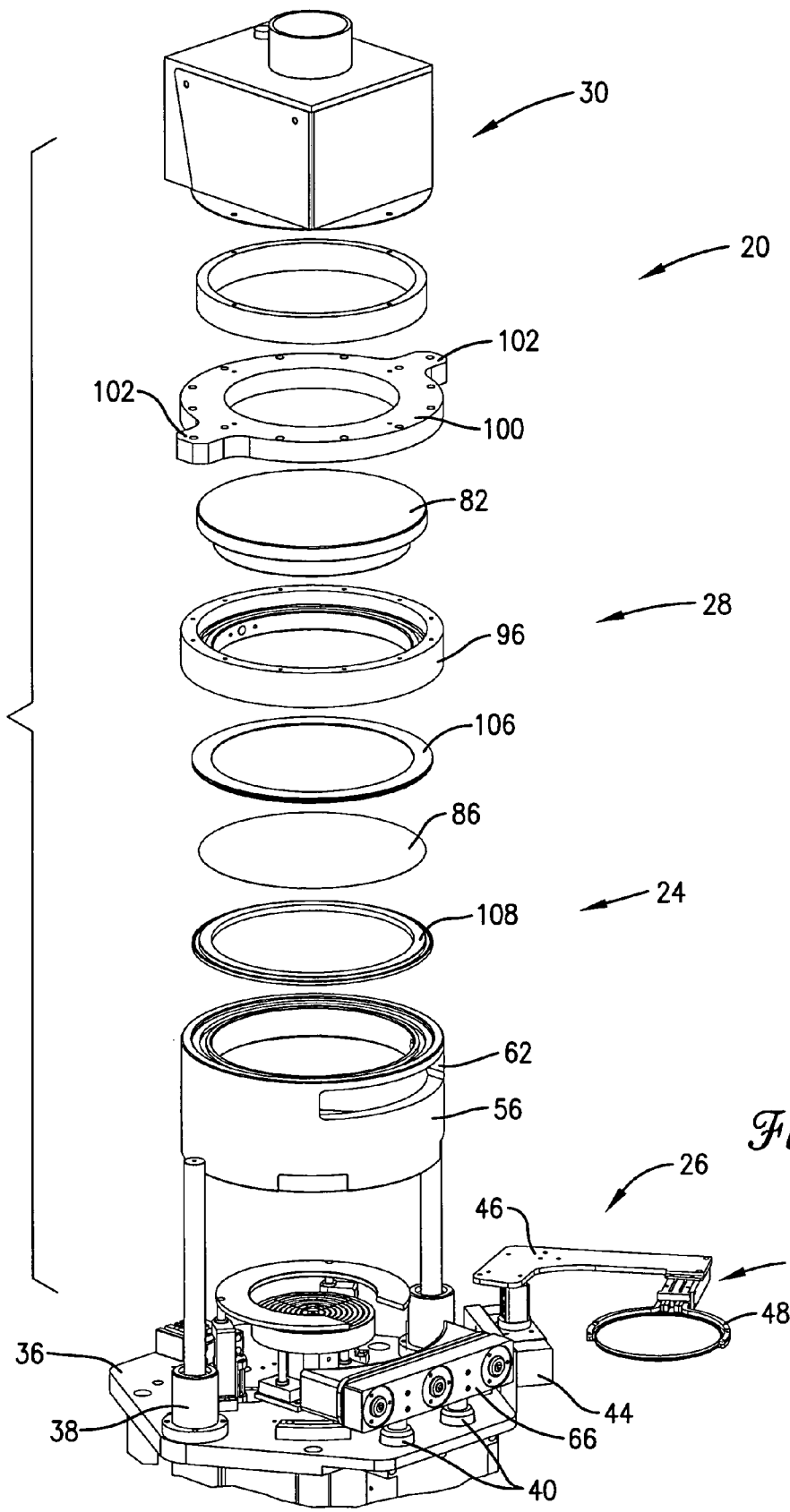
FIG. 3 is an exploded perspective view illustrating the operative components of the preferred planarizing apparatus.
Figure 5:
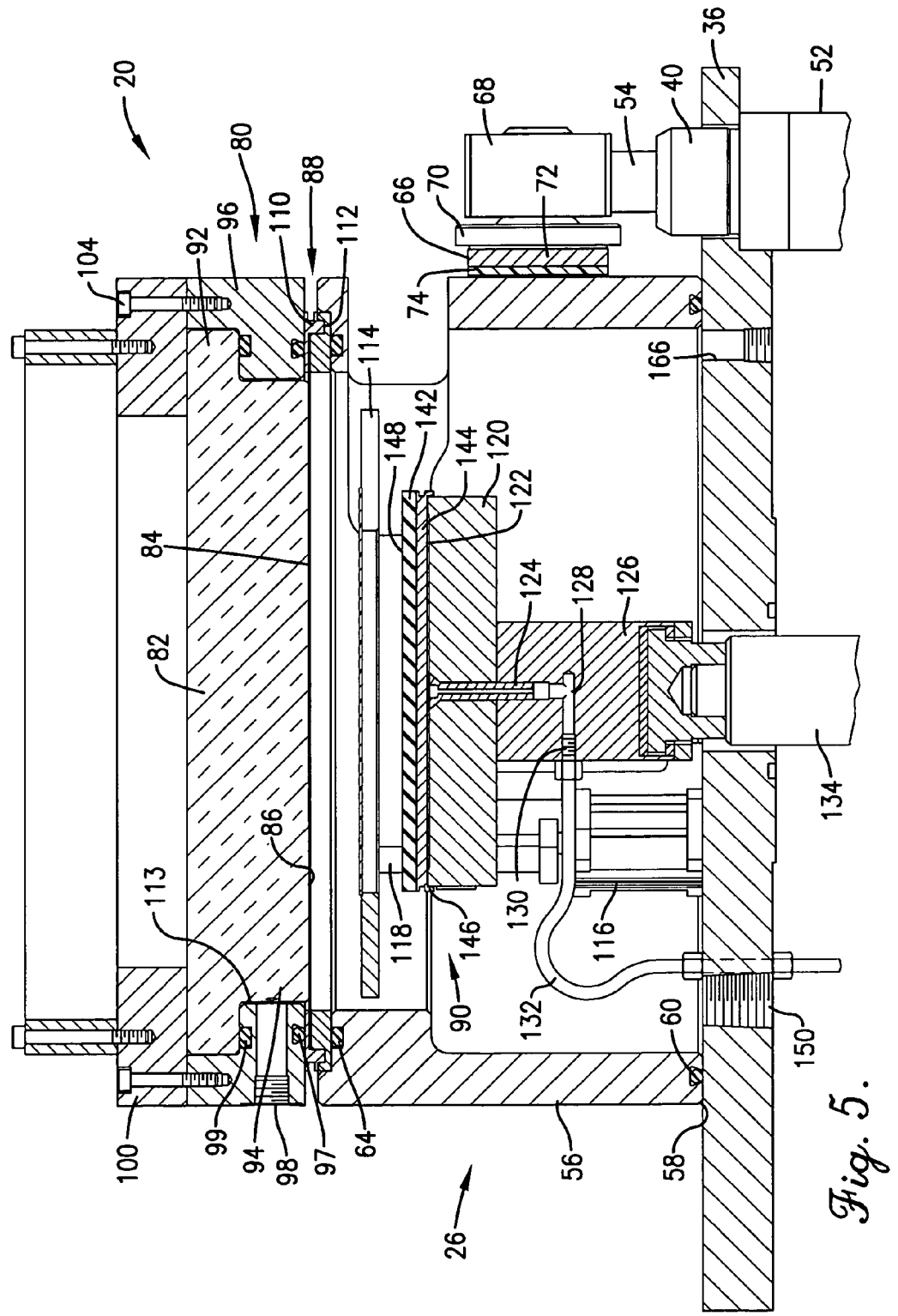
FIG. 5 is a vertical sectional view taken along line 5-5 of FIG. 4 and further illustrating the configuration of the planarizing apparatus.

The vacuum chamber 26 includes an annular, upstanding outer chamber wall 56 presenting a lower surface 58 resting atop plate 36 and secured thereto by peripheral clamps 37; a circular O-ring 60 (see FIG. 5) serves to effect a vacuum seal between the wall 56 and base plate 36. The wall 56 is equipped with an elongated, transverse entryway 62 adjacent the upper margin thereof, leading to the interior of the chamber 26. The upper margin of the wall 56 is of stepped configuration in section, and is equipped with a sealing O-ring 64. The chamber 26 also has a door 66 designed to selectively cover entryway in order to permit establishment of a vacuum condition within the chamber, and allow for insertion and removal of substrates. In particular, the door 66 includes a pneumatic actuator 68, coupler 70 and arcuate segment 72 which conforms to the shape of sidewall 56. A peripheral gasket 74 (see FIG. 5) is provided on the inner face of segment 72 for sealing purposes. As best seen in FIGS. 1, 2 and 5, the door 66 is supported for selective vertical shifting movement by the piston rods 54, so that upon actuation of the assembly 52, the door 66 is moved from the FIG. 1 position to the FIG. 2 position, thereby sealing entryway 62. Door 66 moves vertically upon actuation of assembly 52, then horizontally upon actuation of assembly 68. Alternately, when the assembly 52 is actuated to lower the door 66, the entryway 62 is open (see FIG. 1).

Figure 10:
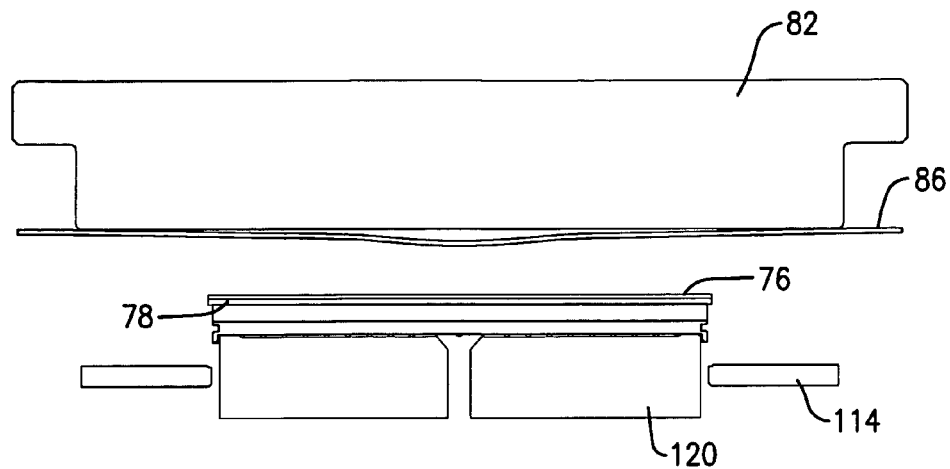
FIG. 10 is a schematic illustration depicting the initial step in the planarizing process wherein the preferred optical flat sheet is deflected.

The planarizing unit 28 includes the components operable for contact planarizing a coating 76 on one surface of a substrate 78 (see FIG. 10). The unit 28 operates in conjunction with the vacuum chamber 26 to effect this planarization. Broadly speaking, the planarizing unit 28 includes an optical flat assembly 80 made up of a UV-transparent optical flat block or body 82 presenting a lower optically flat surface 84, as well as a thin, flexible sheet 86 of optically flat material, the latter being supported by a sheet support 88; and a support assembly 90 beneath the assembly 88 and operable to support and hold the substrate 78 with coating 76 proximal to sheet 86.

In greater detail, the body 82 is of circular configuration, having an upper, radially enlarged section 92 and a depending section 94 terminating in optical flat surface 84. The body 82 is supported within a complemental annular head 96 which also has a threaded port 98 and a sealing ring 99. A retainer ring 100 having a pair of outwardly projecting, opposed ears 102 is positioned atop body 82 and is connected to head 96 via screws 104, thereby securing the body 82 in place. The sheet support 88 includes a pair of opposed upper and lower clamping rings 106, 108 which receive and support the sheet 86. In detail (see FIG. 5), the upper ring 106 includes an annular, depending rib 110 whereas the second or lower ring 108 has a mating groove 112 which receives rib 110. The sheet support 88 and sheet 86 are positioned within the stepped upper margin of wall 56, with the lower ring 108 in engagement with sealing O-ring 64.

Considering FIG. 5 for example, it will be appreciated that the chamber 26 communicates with one face of the sheet 88 whereas wall 56 defines the chamber 26 which is adjacent to and communicates with the lower face of sheet 88. However, another chamber 113 is created between the inner surface of head 96 and body 82 below O-ring 99. The port 98 is in communication with this chamber 113 as shown.

The support assembly 90 within chamber 26 includes an arcuate, generally C-shaped ring-like body 114 which is sized to support the substrate 76. The body 114 is selectively moveable through the medium of two pneumatic piston and cylinder assemblies 116 each having the rod 118 thereof coupled to the underside of body 114. As illustrated in FIG. 5, each assembly 116 is secured to the upper face of base plate 36.

Figure 4:
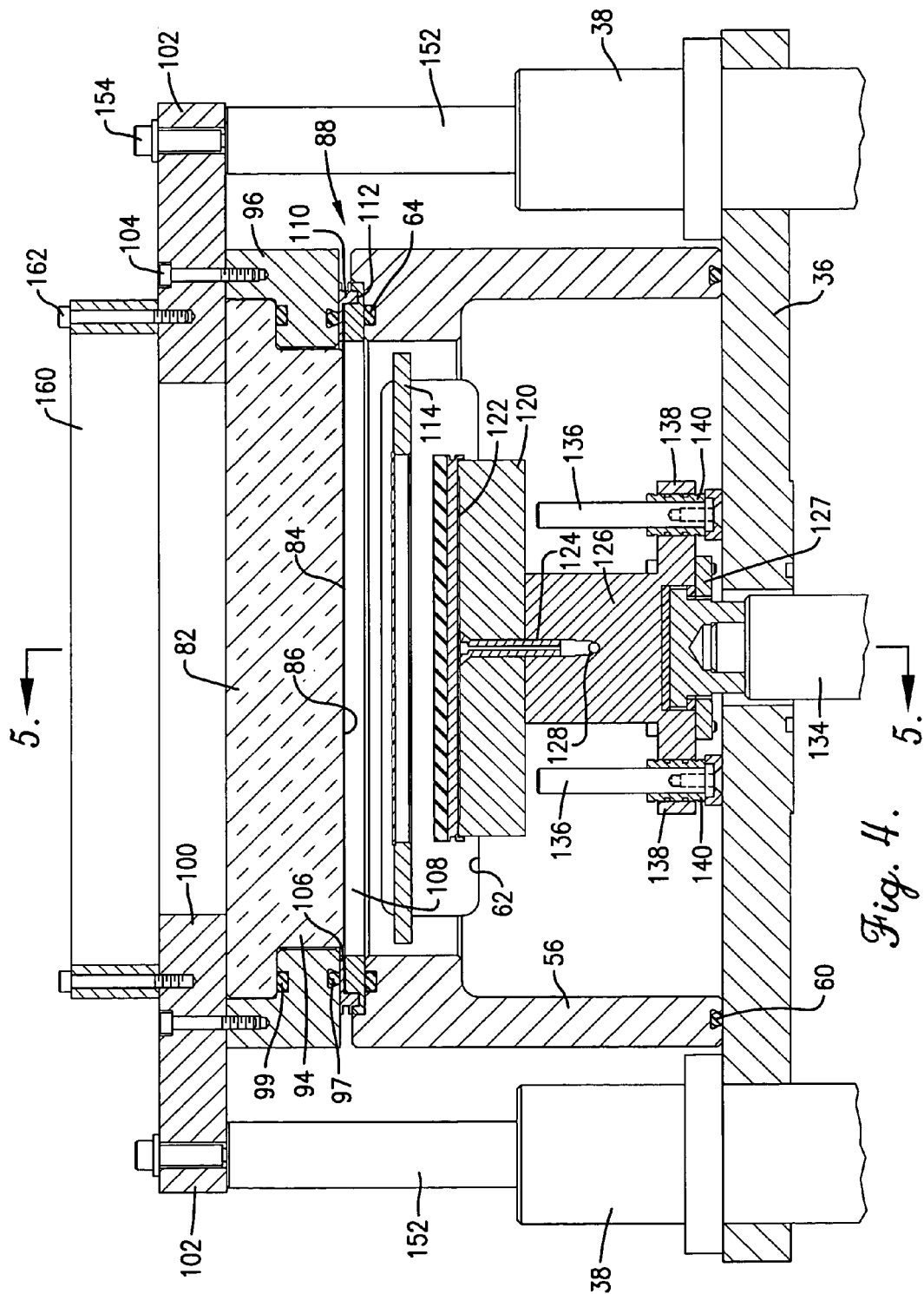
FIG. 4 is a fragmentary vertical sectional view of the planarizing apparatus, with a coated substrate therein and prior to initiation of the planarizing process.

In addition, the assembly 90 includes a circular vacuum chuck 120 which includes an upper, ringed vacuum surface 122 and a central, hollow vacuumizing screw 124 communicating with surface 122. The chuck 120 is supported on a bored block 126 which receives the lower end of screw 124. Block 126 includes an L-shaped vacuum passageway 128 terminating in a fitting 130. A flexible pneumatic hose 132 is secured to fitting 130 and passes through base plate 36 as shown for connection to a vacuum source (not shown). The block 126 and chuck 120 are vertically moveable within chamber 26 by means of piston and cylinder assembly 134, operably secured to the lower end of block 126 through coupler 127. Reciprocation of the block 126 and chuck 120 is guided by a pair of spaced, upright rods 136 secured to base plate 36. As best shown in FIG. 4, the block 126 has laterally extending sections 138 each equipped with a slide bushing 140 to ensure smooth up and down reciprocation of the block 126.

In the preferred practice of the invention, use is made of a resilient platen 142 which is of circular configuration and is adapted to overlie surface 122 of chuck 120. The platen 142 includes a lowermost bottom plate 144 having a depending peripheral lip 146, together with an upper resilient pad 148. As best seen in FIG. 5, the platen 142 is sized to complementally fit on the surface 122 of chuck 120.

A threaded port 150 is provided through base plate 36. A vacuum pump (not shown) is operably coupled with the port 150 and with hose 132 for purposes to be described. In addition, another pneumatic hose (not shown) is secured to port 98 provided in head 96 for alternate drawing of a vacuum and injection of positive pressure air.

In order to permit opening of apparatus 20, upper planarizing unit 28, UV light carrying assembly 30, and the structure carried thereby, are selectively vertically shiftable; this permits changeout of the sheet support 88. To this end, a pair of elongated, vertically oriented rods 152 are provided which are coupled to the ears 102 of retainer 100 via fasteners 154; the rods 152 extend downwardly through the corresponding guides 38 to a point beneath piston and cylinder assembly 50. A crossbar 156 extends between and interconnects the rods 152 at their lower ends. A piston rod 158 forming a part of assembly 50 is secured to crossbar 156. The assembly 50 may be selectively actuated for raising and lowering of the retainer 100. The open and closed positions of the apparatus 20 are shown in FIGS. 1 and 2, respectively.

The light curing assembly 30 is positioned above retainer 100 and includes a spacer ring 160 affixed to retainer 100 by screws 162. Finally, a UV light box 164 is connected to the spacer 160. The light box 164 has a selectively operable UV light source which directs UV light downwardly through optical flat body 82 and sheet 86 as will be described.

The overall apparatus 20 is also provided with conventional control circuitry for monitoring and controlling the planarizing operations. Such control circuitry includes a vacuum sensor, pressure sensor and a gas supply (not shown) secured in threaded port 166 (see FIG. 5) of base plate 36, various other position and condition sensors, and programmable microprocessor controllers. This equipment and the use/programming thereof is well within the skill of the art.

Operation

The planarizing operation of apparatus 20 will now be described. It will be first assumed that the apparatus is in the FIG. 1 position thereof, i.e., the assembly 50 has been actuated to open apparatus 20 so that head 96 and the structure carried thereby is spaced above chamber 26. Also, the support 114 and chuck 120 are in their lowered positions. In this orientation of apparatus 20, a sheet support assembly 88 carrying flexible sheet 86 is positioned atop chamber wall 56 with ring 108 engaging seal 64. The assembly 50 is then actuated to lower head 96 until the underside thereof carrying seal 97 comes into direct engagement with the upper ring support 106. Next, a fresh substrate 78 having a coating 76 thereon is placed upon C-shaped body 114, with the coating 76 facing upwardly. The arm assembly 42 is then actuated to rotate arm 46 so that the support segments 48 carrying platen 142 enter chamber 26 through entryway 62. The platen is thus placed upon the surface 122 of vacuum chuck 120.

Next, the door 66 is closed by operation of the piston and cylinder assembly 52 to extend the rods 54 and operation of pneumatic actuator assembly 68 respectively until gasket 74 comes into circumscribing and sealing relationship with the wall structure about entryway 62, thus establishing a closed chamber 26. A vacuum is then drawn through hose 132 (normally from about 685 to 750 torr) in order to hold the platen 142 in place on the chuck 120. At this point a vacuum is drawn within chamber 26 through port 150, and through port 98 of head 96, sufficient to create a pressure differential across sheet 86 sufficient to deflect the sheet sufficient to deflect the sheet towards region C of substrate coating 76 while the sheet remains spaced from the peripheral region P thereof. Generally, with the preferred apparatus 20, a vacuum of from about 685 to 750 torr is drawn through port 150, whereas a lesser vacuum of from about 635 to 710 torr is drawn through port 98.

Figure 6:
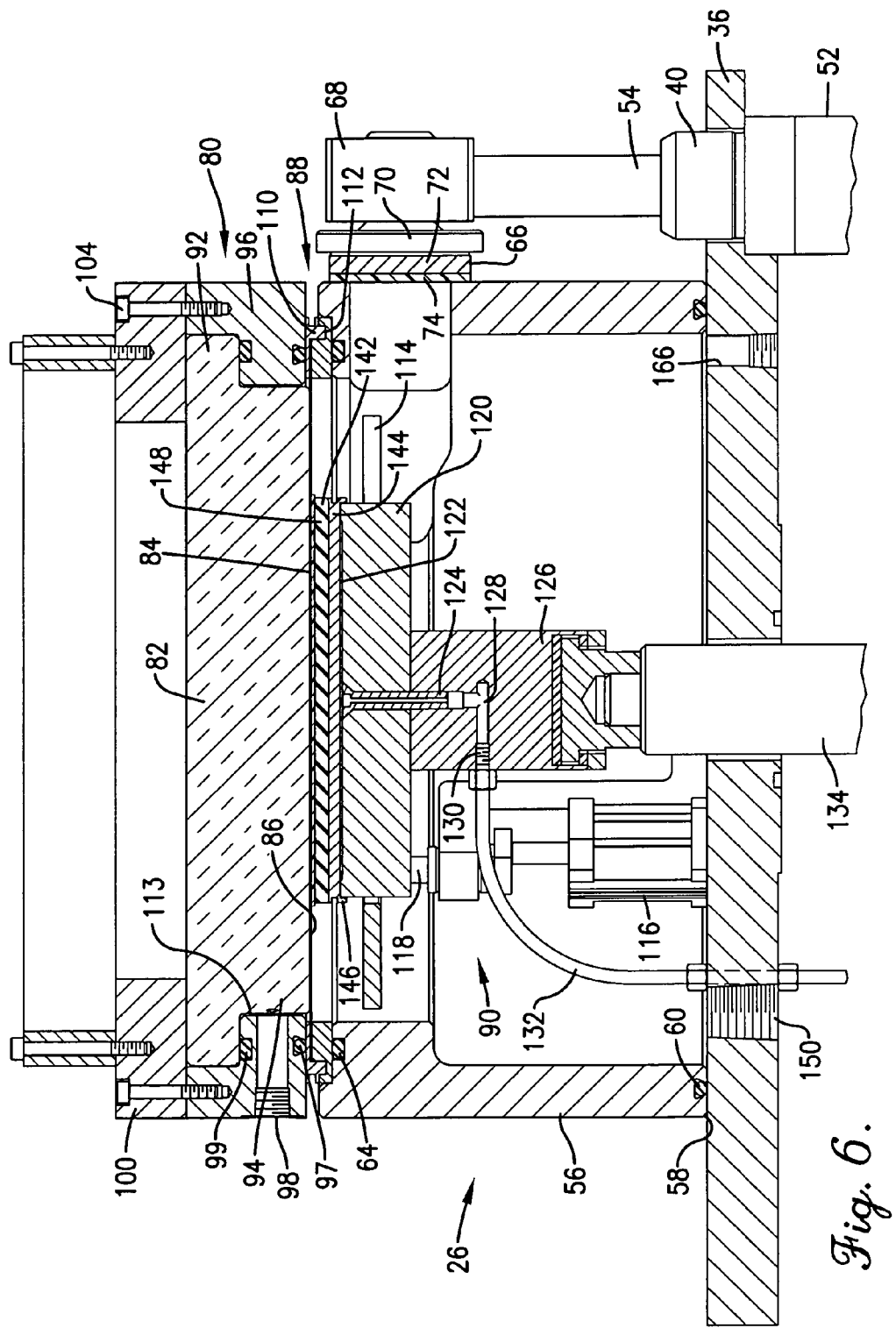
FIG. 6 is a fragmentary vertical sectional view similar to that of FIG. 4, but depicting the apparatus during planarizing contact between the coated substrate and an optical flat body and sheet.
Figure 7:
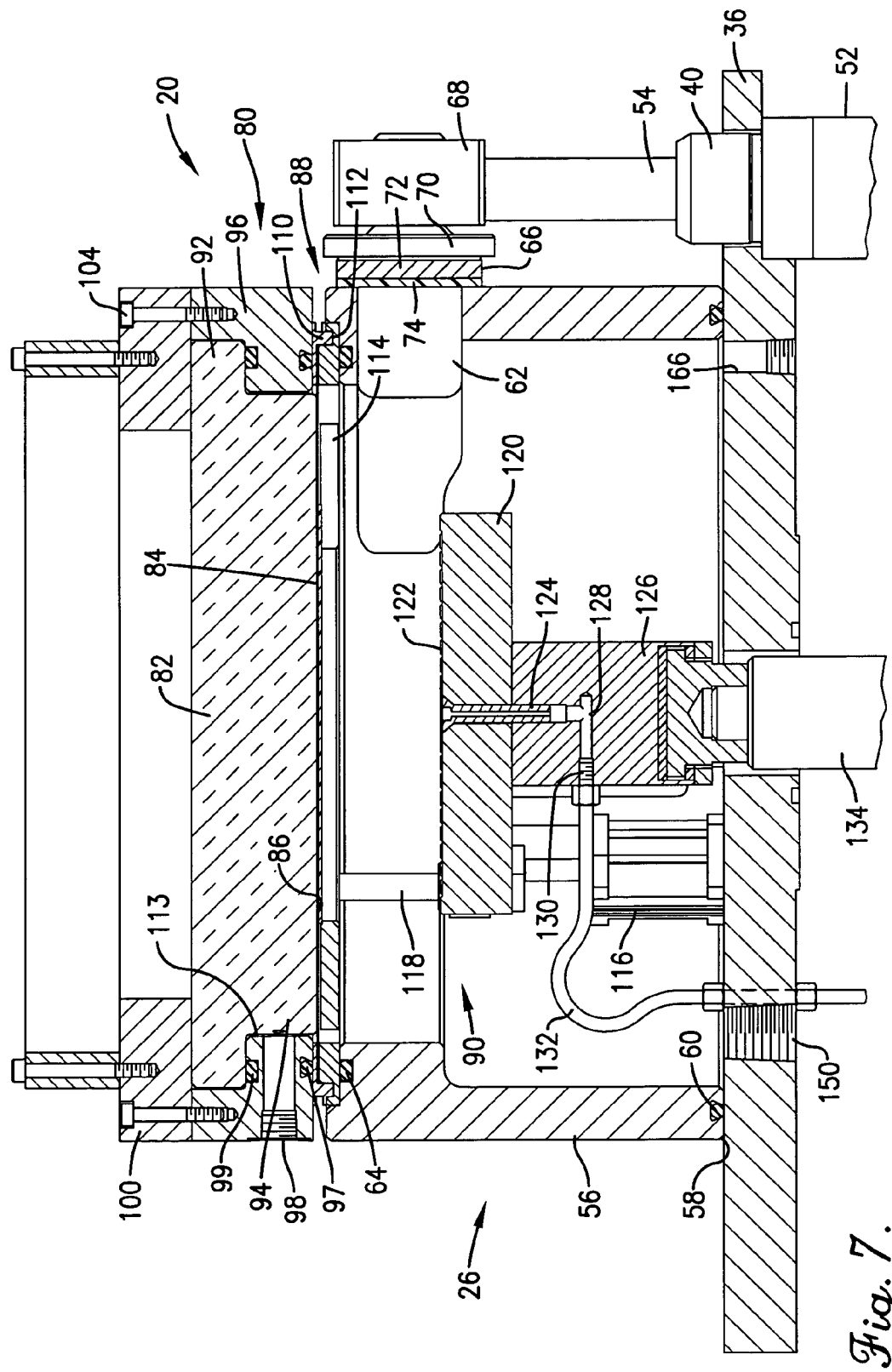
FIG. 7 is a view similar to that of FIG. 6, but depicting the apparatus after planarization of the coated substrate.
Figure 11:
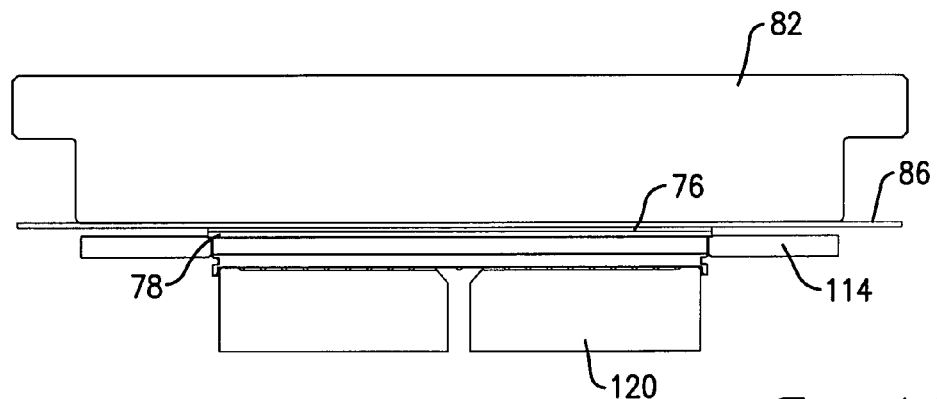
FIG. 11 is another schematic illustration showing the next step in the planarizing process wherein full planarizing contact is established between the coated substrate and the optical flat body and sheet.

In the next step, the assembly 134 is actuated so as to move chuck 120 carrying platen 142 into the position of FIGS. 6 and 11, i.e., in the planarizing position where the coating 76 is fully in contact with sheet 86, the latter fully engaged with the surface 84 of body 82. In order to establish the appropriate planarizing contact, the chuck 120 should exert a pressure of from about 1 to 90 lb/square inch against the substrate 78.

Next, the vacuum, drawn through port 150 and chamber 26 is relieved, and the latter is allowed to return to atmospheric pressure, to release the sheet 86 from its deflected condition.

During such movement of the chuck 120 to the full planarizing position, any entrained air bubbles between the sheet 86 and surface 84 and/or platen 142 are eliminated. Moreover, the sequential movement toward the full planarizing position, involving the initial defection of sheet 86 followed by movement of the chuck 120, has been found to materially expedite the planarizing operation while giving superior end products.

The light assembly 30 is then actuated to cure the coating 76 during the above-described planarizing contact. The wave length of UV light selected for this purpose, and the duration of the light-on condition, is dictated by the nature of the coating to be cured, and these parameters are within the skill of the art.

Figure 8:
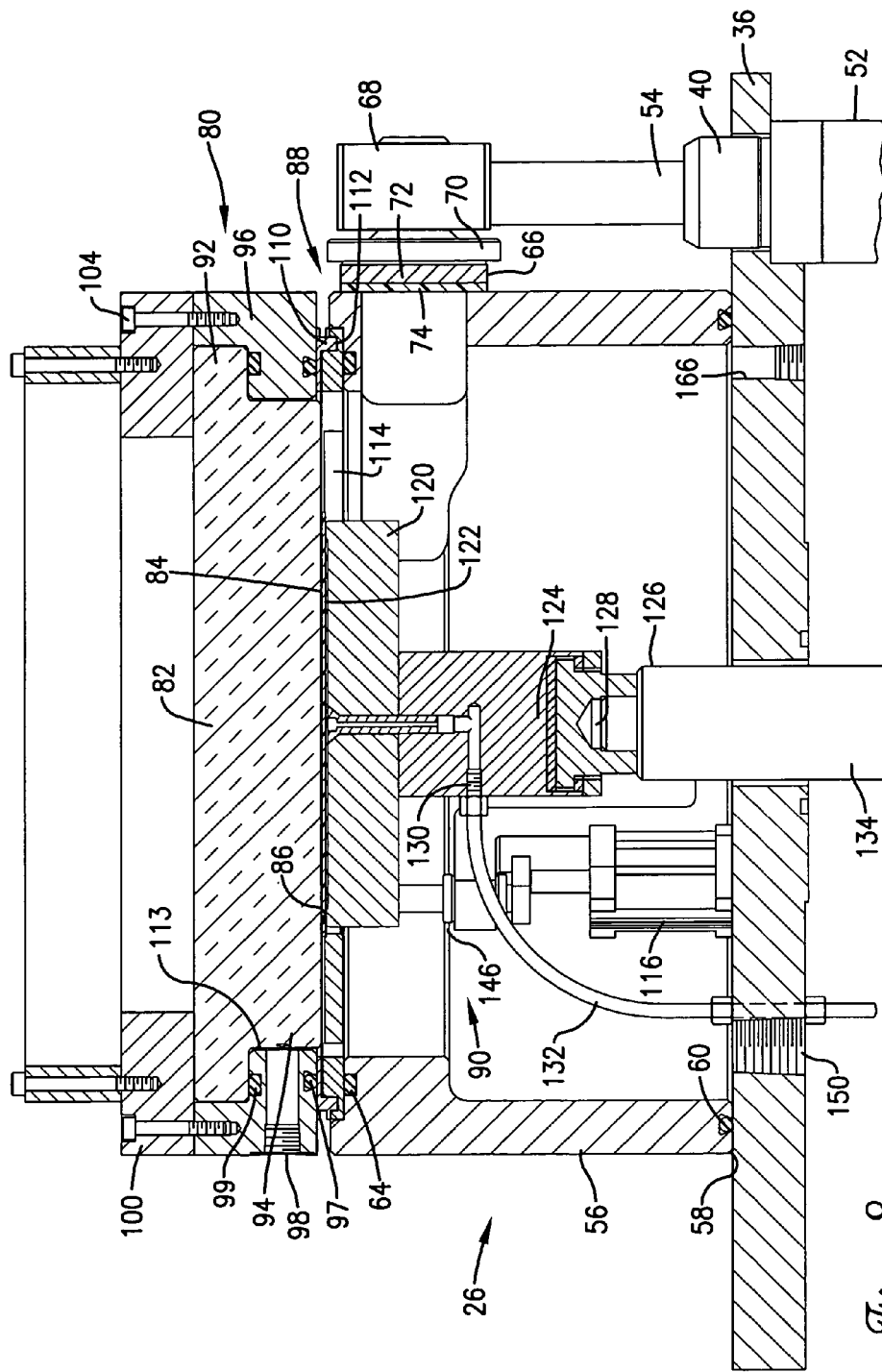
FIG. 8 is a view similar to that of FIG. 7, but showing the apparatus during the separation sequence between the planarized substrate coating and optical flat body and sheet.
Figure 9:
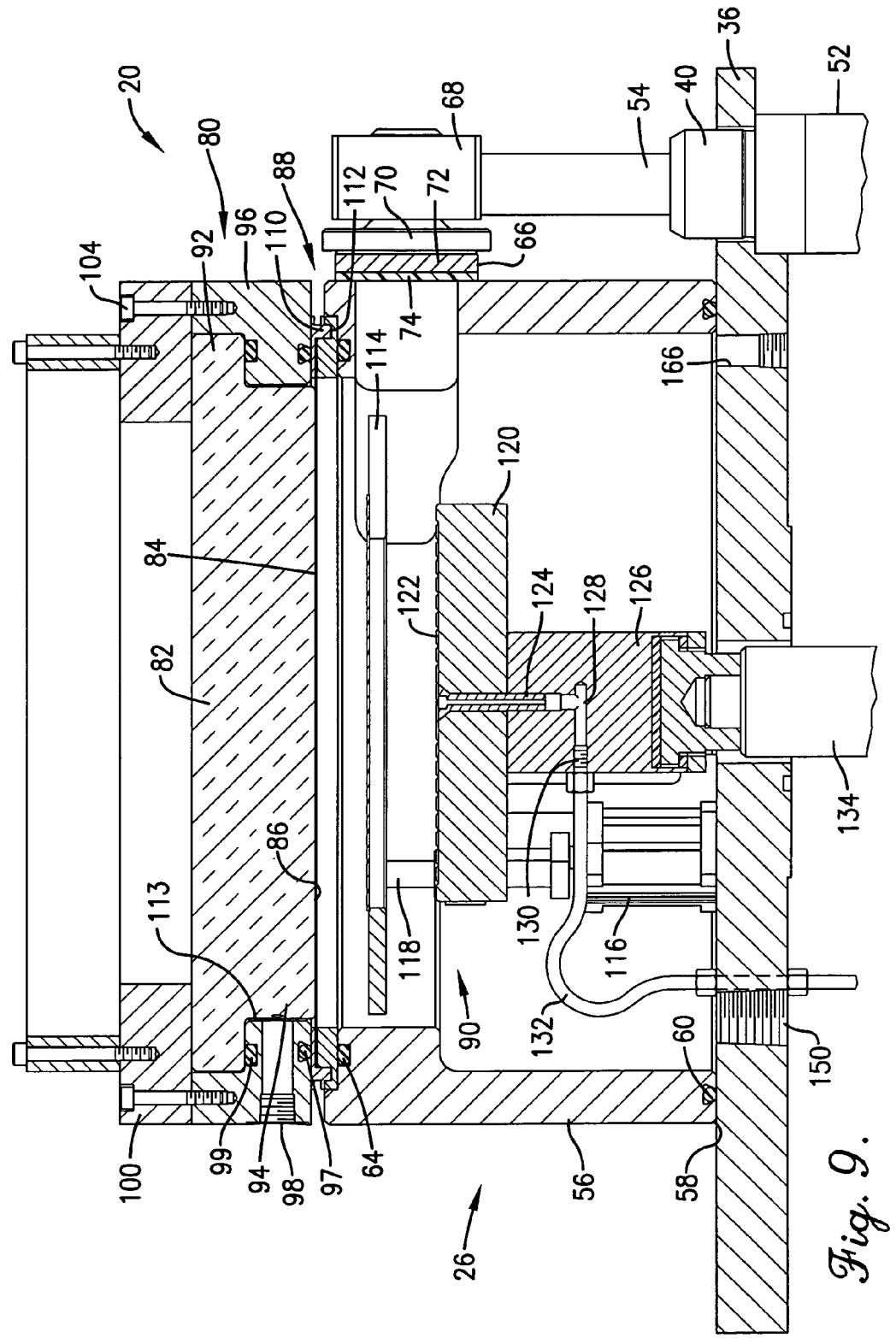
FIG. 9 is a view similar to that of FIG. 8, but showing the apparatus upon full separation between the planarized substrate coating and the optical flat body and sheet.
Figure 12:
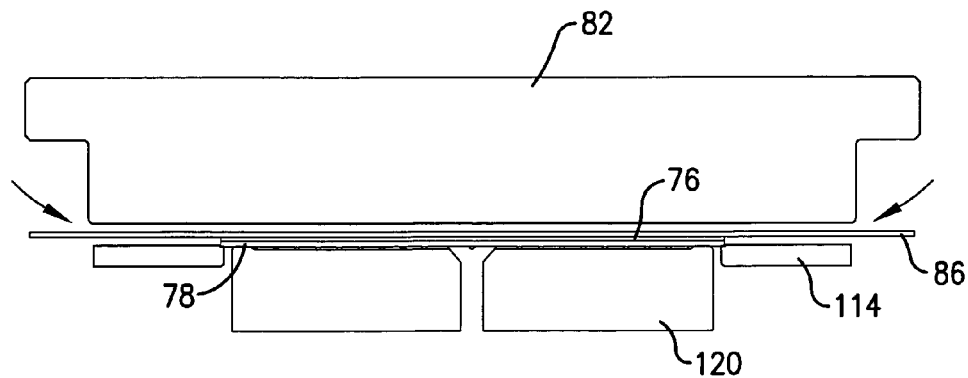
FIG. 12 is a schematic illustration showing the initial stage of the separation sequence between the planarized substrate coating and the optical flat body and sheet.

Once the coating 76 is properly cured and planarized, the apparatus 20 is operated to detach the substrate 78 and coating 76 from sheet 86 and to permit retrieval of the cured substrate and insertion of a fresh coated substrate. In particular, in the next step depicted in FIG. 7, the piston and cylinder assemblies 116 are actuated to move the support 114 to come into contact with the substrate 178 to secure it while the platen 142 is removed. Next, the piston and cylinder assembly 134 is actuated to withdraw chuck 120 and platen 142 from the substrate 78, the vacuum drawn through hose 132 is relieved. The door 66 is then opened and robotic arm assembly 42 is used to retrieve platen 142. The door 66 is then moved back to its chamber-closing position relative to entryway 62, so that the apparatus assumes the FIG. 7 position. Next, the assembly 134 is again actuated to elevate chuck 120 until the vacuum surface 122 thereof comes into direct contact with the substrate 78. This orientation is shown in FIG. 8. Next the piston and cylinder assemblies 116 are actuated to move the support 114 to its lower position away from substrate 78. At this point, the vacuum is drawn through hose 132. An appropriate pressure differential is created across sheet 86 by directing positive pressure air through port 98 of head 96. Normally, a vacuum of from about 685 to 750 torr is drawn through hose 132, while air at a positive pressure of from about 0.5 to 50 psi is directed through port 98. As best seen in FIG. 12, this combination creates a situation where the sheet 86 is cleanly drawn away from surface 84 of body 82 while the sheet remains adhered to coating 76 of substrate 78.

Figure 13:
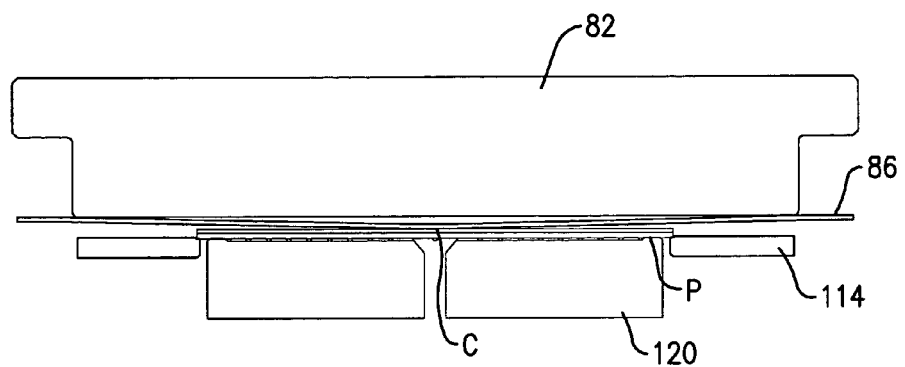
FIG. 13 is a view similar to that of FIG. 12, but showing the next step in the separation sequence.
Figure 14:
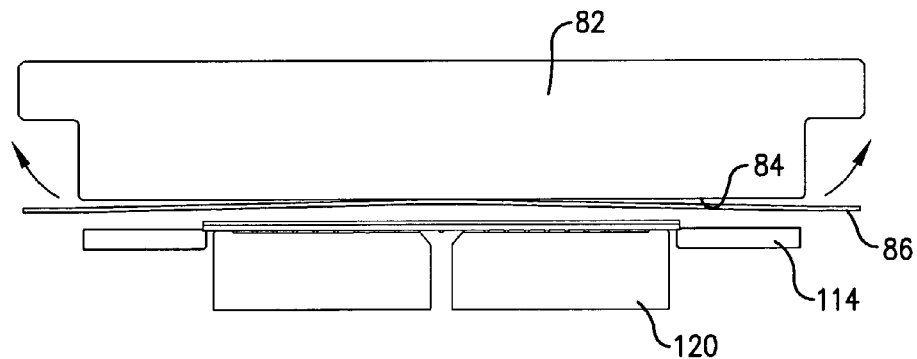
FIG. 14 is a schematic view similar to that of FIG. 13 and showing the final step in the separation sequence.

The next step is depicted in FIG. 13, where it will be seen that a pressure differential is created across sheet 86 sufficient to separate the sheet 86 from the coating 78 at the peripheral region P, while maintaining such contact at the central region C. This is accomplished by slightly shifting the chuck 120 downwardly, while maintaining the vacuum through hose 132 with a corresponding positive pressure delivered through port 98.

The final removal step involves a further shifting of chuck 120 away from body 82. The drawing of the vacuum through port 98 ensures that the sheet 86 moves back into full planarizing contact with the surface 84 of body 82, so that the apparatus 20 is ready to begin the planarization process again.

Embodiment of FIGS. 15-18

The apparatus 20 in preferred forms includes the use of the solid planarized body 82 with lower planarizing surface 84. However, the invention is not so limited. That is, the same improved operational characteristics can be achieved using positive air pressure and vacuum alone, without a solid planarizing body. In FIG. 15-18 this apparatus and method are shown in schematic format. A flexible planarizing sheet 88*a* is provided with adjacent stationary support 114*a* and chuck 120*a*. As shown, the chuck 120*a* holds a substrate 78*a* having a coating 76*a* to be planarized.

Figure 15:
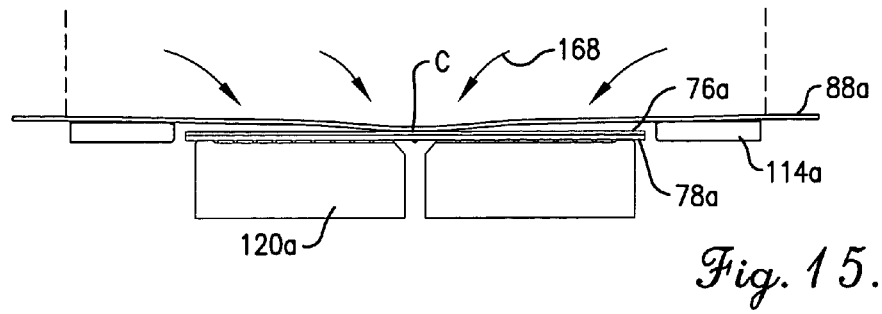
FIG. 15 is a schematic view similar to that of FIG. 10, but illustrating a method and apparatus wherein the optical flat body is eliminated, during the initial deflection of the optical flat sheet.
Figure 16:
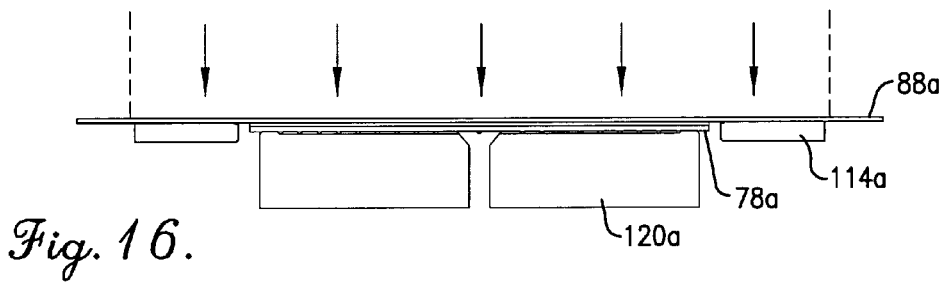
FIG. 16 is a view similar to that if FIG. 15, but depicting the method and apparatus during full planarizing contact between the substrate coating and optical flat sheet.

In the first step of the planarizing operation depicted in FIG. 15, a pressure differential is created to bow the central region C towards the coating 76*a* and substrate 78*a*. The central region C of the sheet 88*a* comes into contact with the corresponding region of the coating, as described in connection with the first embodiment. At this point positive pressure air indicated by arrows 168 is directed against the upper face of sheet 88*a*, while (optionally) a vacuum may be drawn through chuck 120*a*. Next, the chuck 120*a* is moved to the full planarizing position, and additional positive pressure air is directed against the upper face of sheet 88*a*. This ensures the desired full planarizing contact between the sheet 88*a* and coating 76*a*. Of course, during such contact the coating 76*a* is cured, typically by application of UV radiation or heat.

Figure 17:
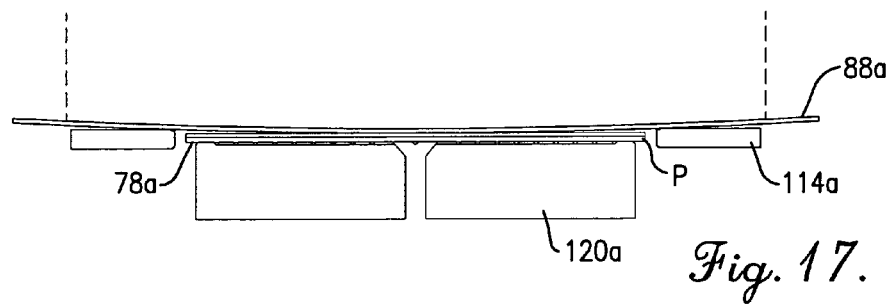
FIG. 17 is a schematic view similar to that of FIG. 16, but showing the initial step in the separation sequence between the planarized substrate coating and the optical flat sheet.
Figure 18:
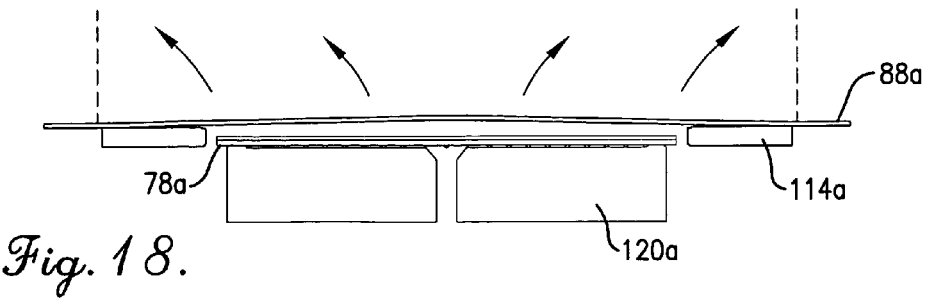
FIG. 18 is a schematic view similar to that of FIG. 17, illustrating the final step in the separation sequence.

FIG. 17 illustrates the first step in the detachment of sheet 88*a* from the now-cured coating 76*a*. This involves creation of a differential pressure across the sheet 88*a*, by application of positive pressure air above the sheet 88*a* and/or drawing a vacuum below sheet 88*a*. In either instance the central region of the sheet 88*a* remains in contact with the coating 76*a* at central region C, whereas the peripheral region P of the coating is spaced from the sheet. In the final step (FIG. 18), a negative pressure is drawn against the face of sheet 88*a* remote from the coating 76*a* thereby fully separating the sheet 88*a* from coating 76*a*, and thereby positioning the apparatus for the next planarizing operation.

EXAMPLE I

In this example, a trench wafer having a photocurable material was planarized using apparatus 20. In particular, a silicon wafer having trench structures about 1 μm was used as the substrate. The featured density of the wafer ranged from about 4-96%. A photocurable material was prepared by thoroughly mixing 20 grams of epoxy (D.E.R. 354LV, Dow Chemical Co.), 80 grams of propylene glycol monomethyl ether (PGME, Aldrich Chemical Co.), and 1.2 grams of Sarcat KI-85 (Sartomer Chemical) in a yellow-lighted laboratory. The material was then filtered using a 0.2 μm filter and stored in a clean brown bottle. A film of the photocurable planarization material less than 0.5 μm thickness was spin-coated onto the silicon trench wafer.

During processing, the closed apparatus chamber was evacuated to less than 20 torr for about 30 seconds to remove residual solvent. During planarization, the substrate was pressed against the Teflon optical flat surface using a force of about 68 psi for 300 seconds. During this time, UV light was used to cure the coating. After UV exposure, the chamber was pressurized to atmospheric, the substrate was separated from the optical flat surface, and the substrate was removed from the chamber.

As a comparison, another similar trench wafer was coated with the same material under identical conditions. This reference product was cured in the same manner, except that there was no press step used. The comparative wafers were characterized using a Tencor Alphastep Profilometer. A surface topography of about 250 Å was measured across the structure produce in accordance with the invention. The reference wafer exhibited a measured surface topography of about 7000 Å. The planarization film thickness within different feature-density areas of the pressure-planarized wafer was measured using a scanning electron microscope. Film thicknesses over feature-density areas, representing a maximum of about 40% difference feature density, were measured. Film thicknesses on top of the structures, not over the trenches, in two feature-density areas were about 0.45 μm, with a thickness difference of about 0.012 μm (120 Å).

EXAMPLE II

In this example a thermocurable material was applied to a silicon wafer. The wafer was prepared by first coating it with a silicon dioxide film having a thickness of about 1 μm. A pattern containing vias of 0.2 to 1 μm in diameter and having various feature density areas was patterned into the silicon dioxide film. The depth of the vias was about 1 μm. A thermocurable material was prepared as set forth in Example I, except that 1.0 grams of Nacure® Super XC-A 230 catalyst (King Industries) was used in lieu of the Sarcat product. The material was spin-coated to a thickness of about 0.2 μm onto the silicon via wafer.

The coated wafer was transferred to the apparatus 20 which, after sealing, was evacuated to less than about 20 torr for about 180 seconds to remove residual solvent. The coated substrate was pressed against the optical flat surface using a force of 68 psi for 60 seconds. during this time a pulsing UV/infrared heating light was illuminated through the optical flat surface to cure the planarization material (120 seconds at a curing temperature of at least about 130° C.). After curing, the chamber was vented to atmospheric, the substrate stage was lowered, the chamber door was opened, and the substrate was removed for characterization.

The planarized via wafer surface was characterized with a Tencor Alphastep profilometer. A surface topography over planarized structures of less than 100 Å and less than about 300 Å across adjacent feature density areas was measured. The planarization film thickness over structures in different feature-density areas was measured using a scanning electron microscope. Two feature-density areas were measured. Film thickness on top of the structures in an area having about 0.3 μm diameter vias with a pitch of about 0.5 μm was measured. Film thickness was also measured on top of the structures in an area having about 0.3 μm-vias with a pitch of about 1.75 μm. The film thickness measured were about 0.19 μm and 0.21 μm, respectively.

EXAMPLE III

In this example, photocurable planarization material consisting of 5 grams of Novolac epoxy resin (D.E.R.™ 354LV, The Dow Chemical Company), 5 grams of t-butyl glycidyl ether (Aldrich), and 0.6 grams of 50% triarylsulfonium hexafluorophosphate (a photo acid generator) solution (Aldrich) was formulated and mixed thoroughly. The solvent used in the photo acid generator solution was a reactive solvent. The material was filtered with 0.2 μm filter.

A 1.7 μm thick layer of the planarization material was coated onto a 6-inch silicon wafer surface that had been treated with an adhesion promoter APX-K1 (Brewer Science, Inc.) using the vendor's recommended process. A standard edge bead removal process was conducted that removed about 5 mm of edge bead.

The substrate was placed within the apparatus 20 as described in previous examples, and pressed against the optical flat surface using a pressure of 68 psi for 30 seconds. During this contact, a continuous UV light from a mercury-xenon lamp was illuminated through the optical flat surface for 10 seconds to cure the planarization material. The pressure was then released and the wafer was removed from the apparatus. A Dektak 8 (Veeco Metrology Group) was used to characterize the planarized surface roughness and the degree of planarization. A step height of approximately 200 Å was found on the 1 μm tall portions of the original substrate structures. A degree of planarization of about 98% was achieved, and no voids were found in the planarized material.

EXAMPLE IV

In this example, a curable material was planarized using air pressure in lieu of the optical flat body 82. The photocurable material and wafers of Example I were used. The coated substrate was placed in the apparatus 20, and the chamber was evacuated to less than 20 torr for about 30 seconds for residual solvent removal. The substrate was then pressed against the optical flat sheet. After such contact, air pressure was applied to the opposite side of the film at a pressure of about 20 psi for 300 seconds. While the surface was thus maintained in contact with the optical flat film, UV light was illuminated through the film for 10 seconds to cure the planarization material. After planarization, the pressure within the chamber was relieved to atmospheric, and the substrate was separated from the film and removed for characterization.

A reference wafer was prepared in the same fashion, except that it was not subjected to the air pressure pressing step. The wafer surface produced according to the invention, and the reference surface were characterized using a Tencor Alphastep Profilometer. A surface topography of about 350 Å was measured across the structures and across adjacent feature density areas in the substrate produce din accordance with the invention. Planarization film thickness within different feature-density areas was measured using a scanning electron microscope. Film thicknesses over feature-density areas, representing a maximum of about 40% difference over feature-density, were measured. Film thicknesses on top of the structures, not over the trenches, into feature-density areas were about 0.45 μm with a thickness difference of about 0.014 μm (140 Å). The reference wafer exhibited a surface topography of about 7000 Å across the topographic structures.

We claim:

1. A method of planarizing a curable coating applied to a substrate, said coating having a surface presenting a surface area with a central region and a surrounding peripheral region, said method comprising the steps of:
    locating a thin, flexible sheet of material in proximal spaced relationship to said surface;
    causing said sheet to deflect by creating a pressure differential across said sheet so that the sheet contacts the central region of said surface area but is spaced from said peripheral region;
    effecting relative movement between the substrate and sheet until the sheet is in face-to-face planarizing contact with substantially all of said surface area;
    curing said surface coating while maintaining said planarizing contact; and
    separating said sheet and substrate after said curing step.

2. The method of claim 1, said sheet being a planarizing sheet.

3. The method of claim 1, said sheet being formed of Teflon.

4. The method of claim 1, including the steps of gripping the outer margin of said sheet, and creating said pressure differential such that a greater pressure exists against the face of said sheet remote from said coating.

5. The method of claim 4, including the step of creating vacuum conditions on opposite faces of said sheet, the vacuum level being greater against the face of said sheet adjacent said coating.

6. The method of claim 1, said movement-effecting step comprising the steps of shifting said substrate toward said sheet to establish said planarizing contact.

7. The method of claim 6, including the steps of providing a resilient platen adjacent the face of said substrate remote from said coating, and shifting said platen into contact with the substrate.

8. The method of claim 1, including the step of pressing said substrate and coating against said sheet to establish said planarizing contact.

9. The method of claim 8, including the step of pressing said substrate and coating against said sheet at a level of from about 1 to 90 psi.

10. The method of claim 1, said curing step comprising the step of subjecting said coating to UV radiation.

11. The method of claim 1, said sheet being substantially transparent to UV radiation, said curing step comprising the step of directing UV radiation through said sheet.

12. The method of claim 1, said separating step comprising the steps of first shifting said substrate away from said sheet until the sheet is at least partially detached from said coating, and thereafter creating a pressure differential across the sheet effective to fully detach the sheet from said coating.

13. The method of claim 1, including the step of providing an optical flat body adjacent the face of said sheet remote from said coating.

14. The method of claim 1, wherein said curing step comprises thermally curing said surface coating.

15. The method of claim 14, wherein said thermally curing is accomplished via infrared heating light.

* * * * *